United States Patent
Chamberlin et al.

(10) Patent No.: US 9,986,637 B2
(45) Date of Patent: May 29, 2018

(54) SUBSTRATE CONTAINING LOW-DK-CORE GLASS FIBERS HAVING LOW DIELECTRIC CONSTANT (DK) CORES FOR USE IN PRINTED CIRCUIT BOARDS (PCBS), AND METHOD OF MAKING SAME

(71) Applicant: International Business Machines Corporation, Armonk, NY (US)

(72) Inventors: Bruce J. Chamberlin, Vestal, NY (US); Joseph Kuczynski, North Port, FL (US); Paula M. Nixa, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 90 days.

(21) Appl. No.: 15/211,809

(22) Filed: Jul. 15, 2016

(65) Prior Publication Data
US 2016/0330834 A1 Nov. 10, 2016

Related U.S. Application Data

(62) Division of application No. 14/620,880, filed on Feb. 12, 2015, now Pat. No. 9,456,496.

(51) Int. Cl.
*H05K 1/03* (2006.01)
*C09D 143/04* (2006.01)
(Continued)

(52) U.S. Cl.
CPC ......... *H05K 1/0366* (2013.01); *C03B 37/022* (2013.01); *C03B 37/0756* (2013.01);
(Continued)

(58) Field of Classification Search
CPC .. H05K 1/02; H05K 1/03; H05K 1/24; H05K 1/36; H05K 1/366; H05K 3/42; H01L 23/12; H01L 23/14; H01L 23/145
(Continued)

(56) References Cited

U.S. PATENT DOCUMENTS 4,206,967 A 6/1980 Onoda et al.
4,758,259 A 7/1988 Jensen
(Continued)

FOREIGN PATENT DOCUMENTS

CN 202533604 U 11/2012
EP 2286292 2/2011
(Continued)

OTHER PUBLICATIONS

Wallenberger et al., "Fiberglass and Glass Technology: Energy-Friendly Compositions and Applications", Springer Science & Business Media, Nov. 27, 2009, 478 pages, pp. 49-50.
(Continued)

Primary Examiner — Xiaoliang Chen
(74) Attorney, Agent, or Firm — Matthew J. Bussan (57) ABSTRACT

An enhanced substrate for use in printed circuit boards (PCBs) includes low-Dk-core glass fibers having low dielectric constant (Dk) cores. In some embodiments, the low-Dk-core glass fibers are filled with a low Dk fluid, such as a gas (e.g., air, nitrogen and/or a noble gas) or a liquid. After via holes are drilled or otherwise formed in the substrate, silane is applied to the ends of hollow glass fibers exposed in the via holes to seal the low Dk fluid within the cores of the hollow glass fibers. In some embodiments, the low-Dk-core glass fibers are filled with a solid (e.g., a low Dk resin). For example, a hollow glass fiber may be provided, and then filled with a low Dk resin in a liquid state. The low Dk resin within the hollow glass fiber is then cured to a solid state.

8 Claims, 5 Drawing Sheets

(51) Int. Cl.
*C09D 139/04* (2006.01)
*C09D 183/04* (2006.01)
*C03B 37/022* (2006.01)
*C03B 37/075* (2006.01)
*H05K 1/11* (2006.01)
*H05K 1/02* (2006.01)
*H05K 3/42* (2006.01)

(52) U.S. Cl.
CPC ......... *C09D 139/04* (2013.01); *C09D 143/04* (2013.01); *C09D 183/04* (2013.01); *H05K 1/115* (2013.01); *H05K 3/42* (2013.01); *H05K 1/024* (2013.01); *H05K 3/429* (2013.01); *H05K 2201/029* (2013.01); *H05K 2201/09545* (2013.01); *H05K 2203/1147* (2013.01)

(58) Field of Classification Search
USPC ..... 174/255, 258, 259; 428/209, 313.3, 375; 361/328, 330, 760, 793; 65/443; 343/872; 416/146
See application file for complete search history.

(56) References Cited

U.S. PATENT DOCUMENTS

| | | | | |
|---|---|---|---|---|
| 5,408,244 | A * | 4/1995 | MacKenzie | H01Q 1/422 343/872 |
| 6,344,309 | B2 | 2/2002 | Fukushima et al. | |
| 6,539,155 | B1 | 3/2003 | Broeng et al. | |
| 6,735,369 | B2 | 5/2004 | Komachi et al. | |
| 7,320,232 | B2 | 1/2008 | Paek et al. | |
| 7,615,705 | B2 | 11/2009 | Chamberlin et al. | |
| 8,280,212 | B2 | 10/2012 | Goell et al. | |
| 8,433,167 | B2 | 4/2013 | Falkenstein et al. | |
| 8,974,888 | B2 | 3/2015 | Balcome et al. | |
| 2002/0058140 | A1* | 5/2002 | Dana | C03C 25/101 428/375 |
| 2003/0203174 | A1* | 10/2003 | McCarthy | H05K 1/034 428/209 |
| 2004/0130877 | A1* | 7/2004 | Okubora | H01L 23/145 361/793 |
| 2005/0025967 | A1* | 2/2005 | Lawton | C03C 25/00 428/375 |
| 2008/0050076 | A1 | 2/2008 | Li et al. | |
| 2009/0225524 | A1* | 9/2009 | Liu | H05K 3/0047 361/760 |
| 2010/0212944 | A1 | 8/2010 | Gelorme et al. | |
| 2011/0214909 | A1 | 9/2011 | Boday et al. | |
| 2012/0033923 | A1 | 2/2012 | Takenaga et al. | |
| 2013/0014977 | A1 | 1/2013 | Chamberlin et al. | |
| 2013/0016465 | A1 | 1/2013 | Chamberlin et al. | |
| 2013/0052409 | A1 | 2/2013 | Balcome et al. | |

FOREIGN PATENT DOCUMENTS

| | | |
|---|---|---|
| JP | 3877152 B2 | 2/2007 |
| WO | 2009148492 A2 | 12/2009 |

OTHER PUBLICATIONS

"Hollow glass fibres (H-glass): A new low density structural material", R&G Faserverbundwerkstoffe GmbH, downloaded from <http://www.r-g.de/w/images/c/ca/Td_en_hollow_glass_pdf> on Nov. 26, 2014, 1 page.

U.S. Appl. No. 13/221,268, to Balcome et al., entitled "Preventing Conductive Anodic Filament (CAF) Formation by Sealing Discontinuities in Glass Fiber Bundles", filed Aug. 30, 2011, assigned to International Business Machines Corporation.

Plueddemann, "Silane Coupling Agents," 2nd edition, Plenum Press, New York, 1991, Table 1.10 "Critical Surface Tensions of Silane Coupling Agent Film" (p. 23) and Table 2.2 "Representative Commercial Silanes" (p. 34).

Murai et al., "Newly Developed Low-Transmission-Loss Multilayer Materials for PWBs Applied to High GHz Bands", Hitachi Chemical Co. Ltd., downloaded from <http://www-03.ibm.com/procurement/proweb.nsf/objectdocswebview/filepcb+-+ibm+101809+hitachi+chemical.pdf/$file/ibm+101809+hitachi+chem.pdf> on Dec. 10, 2014, pp. 1-31.

http://www.ami.ac.uk/courses/topics/0152_caf/index.html, "The CAF mechanism," 5 pages, document accessed Aug. 6, 2011.

http://www.wou.edu/las/physci/ch462/redox.htm, "Diagrams That Provide Useful Oxidation-Reduction Information," 5 pages, document accessed Aug. 6, 2011.

Krull, "IBM Laminate Study Group, Lead-Free Laminate Robustness," IBM PCB Symposium, Dec. 10, 2009, 18 pages. (Document available at: http://www-03.ibm.com/procurement/proweb.nsf/objectdocswebview/filepcb+-+brett+krull+laminate+robustness+symposium+presentation.pdf/$file/brett+krull+laminate+robustness+symposium+presentation.pdf).

U.S. Appl. No. 14/620,880, to Chamberlin et al., entitled "Substrate Containing Low-Dk-Sore Glass Fibers Having Low Dielectric Constant (Dk) Cores for Use in Printed Circuit Boards (PCBs), and Method of Making Same", filed Feb. 12, 2015, assigned to International Business Machines Corporation.

List of IBM Patents or Patent Applications Treated as Related.

* cited by examiner

SUBSTRATE CONTAINING LOW-Dk-CORE GLASS FIBERS HAVING LOW DIELECTRIC CONSTANT (Dk) CORES FOR USE IN PRINTED CIRCUIT BOARDS (PCBS), AND METHOD OF MAKING SAME

CROSS-REFERENCE TO RELATED APPLICATION

This patent application is a divisional application of pending U.S. patent application Ser. No. 14/620,880, filed Feb. 12, 2015, entitled "SUBSTRATE CONTAINING LOW-Dk-CORE GLASS FIBERS HAVING LOW DIELECTRIC CONSTANT (Dk) CORES FOR USE IN PRINTED CIRCUIT BOARDS (PCBs), AND METHOD OF MAKING SAME", which is hereby incorporated herein by reference in its entirety.

BACKGROUND

The present invention relates in general to printed circuit boards (PCBs) containing glass fiber substrates. More particularly, the present invention relates to an enhanced substrate containing low-Dk-core glass fibers having low dielectric constant (Dk) cores for use in PCBs, and to a method of making same.

SUMMARY

According to some embodiments of the present invention, an enhanced substrate for use in printed circuit boards (PCBs) includes low-Dk-core glass fibers having low dielectric constant (Dk) cores. In some embodiments of the present invention, the low-Dk-core glass fibers are filled with a low Dk fluid, such as a gas (e.g., air, nitrogen and/or a noble gas) or a liquid. After via holes are drilled or otherwise formed in the substrate, silane is applied to the ends of hollow glass fibers exposed in the via holes to seal the low Dk fluid within the cores of the hollow glass fibers. In some embodiments of the present invention, the low-Dk-core glass fibers are filled with a solid (e.g., a low Dk resin). For example, a hollow glass fiber may be provided, and then filled with a low Dk resin in a liquid state. The low Dk resin within the hollow glass fiber is then cured to a solid state. The enhanced substrate not only lowers Df/Dk (i.e., it has a low dissipation factor (Df) and a low Dk), but also results in a more uniform Df/Dk and minimizes skew when used in PCBs.

BRIEF DESCRIPTION OF THE SEVERAL VIEWS OF THE DRAWINGS

Embodiments of the present invention will hereinafter be described in conjunction with the appended drawings, where like designations denote like elements.

DETAILED DESCRIPTION

Dielectric loss is an important type of signal loss in printed circuit boards (PCBs). Dielectric loss is a function of the PCB substrate material. Different PCB substrate materials can be compared, in terms of loss performance, by a parameter known as dissipation factor (Df). Df is a measure of loss-rate of energy of a mode of oscillation in a dissipative system. It is the reciprocal of quality factor (Q), which represents the quality or durability of oscillation. The Df of a PCB laminate will vary depending on the PCB substrate material used to make it, as well as signal frequency. PCB laminates made from PCB substrate materials having lower Df values, all else being equal, exhibit lower dielectric loss.

Dielectric constant (Dk) is another important parameter related to dielectric loss in PCBs. Dk is also referred to as relative permittivity. In a PCB laminate, the Dk is the ratio of the capacitance between a pair of conductors separated by a dielectric material (e.g., epoxy-based resin) compared to the capacitance between that pair of conductors in a vacuum. The Dk of a PCB laminate will vary depending on the PCB substrate material used to make it, as well as signal frequency. PCB substrate materials with lower Dk values contribute to a lower dielectric loss. Moreover, in PCB laminates made from PCB substrate materials with higher Dk values, signals will propagate more slowly through the conductors. In fact, the propagation delay time is a function of the square root of the Dk value of the PCB substrate material.

As signal speeds increase (i.e., as signal frequency increases), the need for PCB substrate materials having low Dk (e.g., at 1-3 GHz, Dk≤4.0, preferably Dk<3.7, more preferably Dk<3.5) and low Df (e.g., at 1-3 GHz, Df<0.010, preferably Df<0.007, more preferably Df<0.005, still more preferably Df<0.003) becomes critical. Such PCB substrate materials are sometimes referred to as "low Df and Dk resins" or "low Df/Dk resins".

PCBs are commonly constructed of a glass cloth or other glass fiber substrate impregnated with a varnish coating (e.g., epoxy-based resin). As differential pairs (i.e., a differential pair is two complementary transmission lines that transfer equal and opposite signals down their length) are routed through the PCB, the transmission line of the differential pair closest to the glass fiber will propagate the signal more slowly (because the Dk value of the glass fiber is higher than the Dk value of the resin) resulting in skew. Use of spread glass, where the pitch between the glass fiber bundles (i.e., the glass cloth is typically constructed of bundles of glass fibers woven together in an orthogonal fashion) is reduced, helps to alleviate this skew problem to a marginal extent. Also, rotating the image by 10° also helps offset skew to some extent, but at the cost of using more area. Consequently, a need exists to not only lower Df/Dk, but also to obtain a more uniform Df/Dk and minimize skew.

In accordance with some embodiments of the present invention, an enhanced substrate for use in printed circuit boards (PCBs) includes low-Dk-core glass fibers having low dielectric constant (Dk) cores. In some embodiments of the present invention, the low-Dk-core glass fibers are filled with a low Dk fluid, such as a gas (e.g., air, nitrogen and/or a noble gas) or a liquid. After via holes are drilled or otherwise formed in the substrate, silane is applied to the ends of hollow glass fibers exposed in the via holes to seal the low Dk fluid within the cores of the hollow glass fibers. In some embodiments of the present invention, the low-Dk-core glass fibers are filled with a solid (e.g., a low Dk resin). For example, a hollow glass fiber may be provided, and then filled with a low Dk resin in a liquid state. The low Dk resin within the hollow glass fiber is then cured to a solid state. The enhanced substrate not only lowers Df/Dk (i.e., it has a low Df and a low Dk), but also results in a more uniform Df/Dk and minimizes skew when used in PCBs.

In some embodiments of the present invention, during a plated through-hole (PTH) via fabrication process, hollow glass fibers and glass fiber bundles (composed of a plurality of individual hollow glass fibers) exposed in a drilled through-hole are selectively sealed. For example, after the through-hole is drilled in a substrate, the substrate may be subjected to an aqueous silane bath (e.g., an organo trialkoxysilane in an aqueous solution of an acid that acts as a catalyst) to deposit a layer of silane on the exposed hollow glass fiber bundle ends. Immersion process parameters (e.g., temperature, pH, silane concentration, and immersion time) are adjusted to deposit a suitable layer of silane. For example, trialkoxy groups of the silane may react with exposed silanols on the glass to form a siloxane, which is further polymerized to form a silane polymer barrier layer on the exposed hollow glass fiber ends. The barrier layer effectively seals the hollow glass fibers and the glass fiber bundles and eliminates the conductive anodic filament (CAF) pathway between PTH vias. Additional details regarding the formation of such a silane polymer barrier layer in the context of conventional glass fiber bundles are disclosed in U.S. Patent Application Publication No. 2013/0052409, which is hereby incorporated herein by reference in its entirety.

Hollow glass fibers are commercially available. Generally, however, conventional hollow glass fibers are regarded by those skilled in the art as not suitable for use in PCBs due to moisture incursion. For example, Wallenberger et al., "Fiberglass and Glass Technology: Energy-Friendly Compositions and Applications", Springer Science & Business Media, Nov. 27, 2009, 478 pages, at p. 49 states, "Experimental hollow E-glass fibers have the lowest dielectric constant [96], melt viscosity, and log 3 forming temperature and therefore would require the least energy of all eight examples shown in Table 1.17. They can be made in a large conventional fiberglass furnace but would require special bushing technology. But they are not suitable for use in printed circuit boards. After drilling holes into a composite, water can enter into the hollow fiber cores, and the presence of water could uncontrollably raise the dielectric constant." Filling the hollow glass fiber with a solid core or sealing the ends of the hollow glass fibers with a silane polymer barrier layer, in accordance with some embodiments of the present invention, overcomes the above-noted moisture incursion problem associated with the use of hollow glass fibers in PCBs.

As mentioned above, printed circuit boards (PCBs) are commonly constructed of a glass cloth or other glass fiber substrate impregnated with a varnish coating (e.g., epoxy-based resin). PCBs are also known as printed wiring boards (PWBs). The glass cloth is typically constructed of bundles of glass fibers woven together in an orthogonal fashion, with the bundles typically being perpendicular to each other. The varnish/glass substrate is laminated to copper foil, forming "cores" which are subsequently etched to form the desired features. These cores are then laminated together using partially cured varnish/glass layers (typically in the form of one or more "prepregs") with temperature and pressure, causing the varnish coating to flow between the layers to form a robust composite laminate structure. A sheet of what is referred to as "prepreg" is a glass cloth impregnated with a resin solution which is either dried or at least partially cured.

Figure 1:
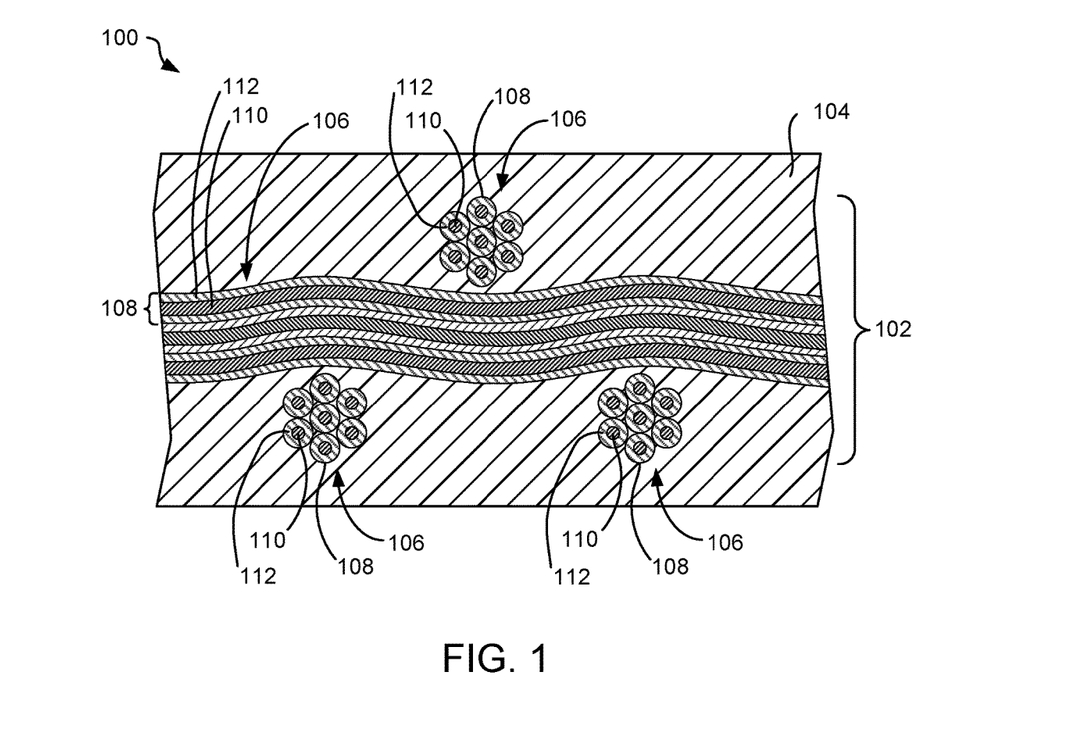
FIG. 1 is a partial, sectional view of an enhanced varnish/glass substrate containing low-Dk-core glass fibers having low dielectric constant (Dk) solid cores in accordance with some embodiments of the present invention.

FIG. 1 is a cross-sectional view of an enhanced varnish/glass substrate 100 containing low-Dk-core glass fibers 108 having low dielectric constant (Dk) solid cores 110 in accordance with some embodiments of the present invention. In the embodiment shown in FIG. 1, the low Dk solid core 110 comprises a low Dk solid (e.g., a low Dk resin). The enhanced varnish/glass substrate 100 includes a glass cloth 102 impregnated with a varnish coating 104. The glass cloth 102 is constructed of a number of glass fiber bundles 106 that are woven together in an orthogonal fashion. From the perspective illustrated in FIG. 1, the glass fiber bundles 106 extend within the glass cloth 102 in a transverse direction (these bundles extend between left and right, one such glass fiber bundle 106 is shown in FIG. 1) and a normal direction (these bundles extend into the page, three such glass fiber bundles 106 are shown in FIG. 1). Each glass fiber bundle 106 includes two or more individual low-Dk-core glass fibers 108 that are typically wound around one another (e.g., in the example shown in FIG. 1, each glass fiber bundle 106 consists of seven individual low-Dk-core glass fibers 108—six outer low-Dk-core glass fibers wound around a single central low-Dk-core glass fiber).

The varnish coating 104 may be any suitable resin, including but not limited to, an epoxy-based resin, a bismaleimide triazine (BT) resin, a polyphenylene oxide (PPO)/triallylisocyanurate (TAIC) composition, and combinations thereof.

Each of the low-Dk-core glass fibers 108 has a low Dk solid core 110 surrounded by a hollow glass fiber shell 112. Hollow glass fiber shells, such as the hollow glass fiber shells 112 shown in FIG. 1, are also referred to herein as "hollow glass fibers". Each low Dk solid core 110 is comprised of a solid low Dk material (e.g., a low Dk resin) having a Dk value less than that of the hollow glass fiber 112. The low-Dk-core glass fibers 108 may be made using conventional techniques well known to those skilled in the art. For example, a hollow glass fiber may be provided (i.e., produced using conventional techniques well known to those skilled in the art, or obtained commercially), and then filled with a low Dk resin in a liquid state. The low Dk resin within the hollow glass fiber may then be cured to a solid state. Alternatively, the low-Dk-core glass fibers 108 may be made via a co-extrusion process (i.e., glass and a low Dk resin or other low Dk material may be co-extruded to form the low-Dk-core glass fiber 108). Using conventional techniques well known to those skilled in the art, glass fiber substrates, prepregs and/or laminates may be fabricated using the low-Dk-core glass fibers 108.

The hollow glass fiber used in the above example may be any suitable conventional hollow glass fiber. As mentioned above, hollow glass fibers suitable for use as the hollow glass fiber in this example may be produced using conventional techniques well known in the art. For example, a method of making hollow glass fibers suitable for use as the hollow glass fiber in this example is disclosed in U.S. Pat. No. 4,758,259, which is hereby incorporated herein by reference in its entirety.

As also mentioned above, hollow glass fibers suitable for use as the hollow glass fiber in this example are commercially available. Suitable hollow glass fibers for use in this example include, but are not limited to, H-glass hollow glass fibers available from R&G Faserverbundwerkstoffe GmbH, Waldenbuch, Germany. H-glass fibers are made of a proprietary alkali-free alumino-borate glass, and have an outer diameter of 10-12 μm and an inner capillary "tunnel" of 5-6 μm. Such commercially available hollow glass fibers may be, for example, woven to form the glass cloth 102 using techniques well known to those skilled in the art.

Alternatively, hollow glass fiber fabrics suitable for filling (e.g., filling with a low Dk resin) and subsequent use as the glass cloth 102 are commercially available. Hollow glass fiber fabrics for use as the glass cloth 202 include, but are not limited to, H-glass fiber fabric, both plain and with an aminosilane finish, available from R&G Faserverbundwerkstoffe GmbH, Waldenbuch, Germany, under order numbers "190055X" (plain), "190050X" (silane), "190070X" (silane), and "190080X" (silane).

The low Dk resin used in the above example may be any suitable conventional resin having a lower Dk value than that of the hollow glass fiber. Low Dk resins suitable for use as the low Dk resin in this example are commercially available. Suitable low Dk resins include, but are not limited to, epoxy-based resins, bismaleimide triazine (BT) resins, polyphenylene oxide (PPO)/triallylisocyanurate (TAIC) compositions, and combinations thereof.

The hollow glass fibers used in the above example may be filled with a suitable low Dk resin using any of a number of filling techniques known to those skilled in the art. For example, the hollow glass fibers (alone, or as part of a hollow glass fiber fabric) may be filled with a suitable low Dk resin in an uncured, liquid state using capillary action by placing a drop or two of the low Dk resin at one end of each of the hollow glass fibers. One skilled in the art will appreciate that the selection of the low Dk resin (or, more precisely, the viscosity of the selected low Dk resin) affects the ease by which capillary action draws the low Dk resin into the inner capillary "tunnel" of the hollow glass fiber. Optionally, to facilitate the low Dk resin being drawn into the capillary "tunnel" of the hollow glass fiber via capillary action, the viscosity of the low Dk resin may be reduced by dissolving the low Dk resin in a suitable solvent.

In yet another alternative, as mentioned above, the low-Dk-core glass fibers 108 may be made via a co-extrusion process (i.e., glass and a low Dk resin or other low Dk material may be co-extruded to form the low-Dk-core glass fiber 108). For example, the method of making hollow glass fibers disclosed in U.S. Pat. No. 4,758,259, previously incorporated herein by reference, may be modified to deliver a low Dk resin or other low Dk material in a liquid state (in lieu of air) through the annulus of its gas delivery tube, thereby producing the low-Dk-core glass fiber 108 having the low Dk solid core 110 (in lieu of merely producing a hollow glass fiber).

Figure 2:
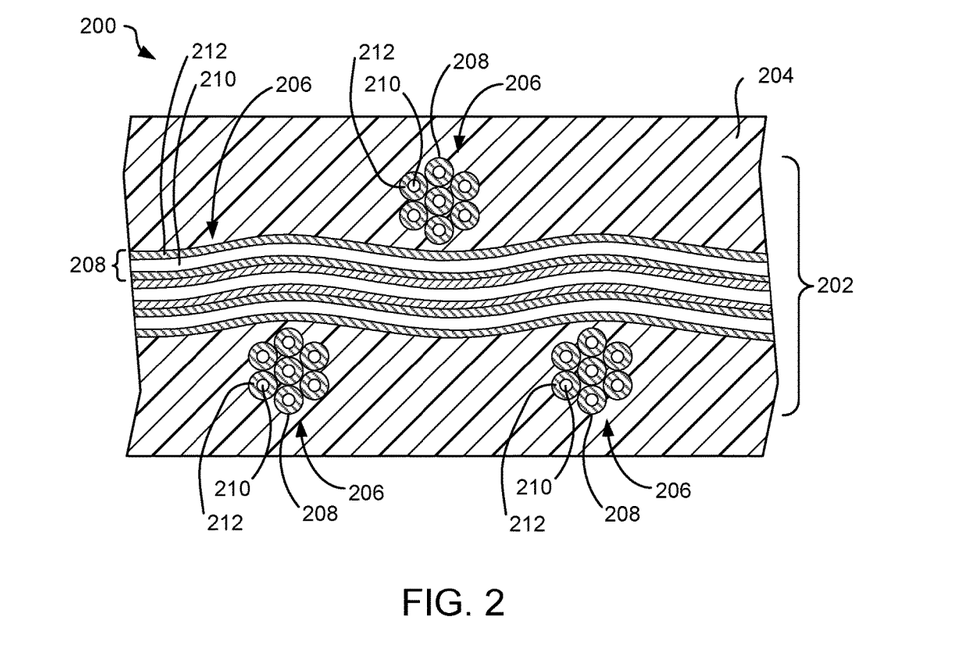
FIG. 2 is a partial, sectional view of an enhanced varnish/glass substrate containing low-Dk-core glass fibers having low dielectric constant (Dk) fluid cores in accordance with some embodiments of the present invention.

FIG. 2 is a cross-sectional view of an enhanced varnish/glass substrate 200 containing low-Dk-core glass fibers 208 having low dielectric constant (Dk) fluid cores 210 in accordance with some embodiments of the present invention. In the embodiment shown in FIG. 2, the low Dk fluid core 210 comprises a low Dk fluid, such as a gas (e.g., air, nitrogen and/or a noble gas) or a liquid, which is sealed within each of the low-Dk-core glass fibers 208. The enhanced varnish/glass substrate 200 includes a glass cloth 202 impregnated with a varnish coating 204. The glass cloth 202 is constructed of a number of glass fiber bundles 206 that are woven together in an orthogonal fashion. From the perspective illustrated in FIG. 2, the glass fiber bundles 206 extend within the glass cloth 202 in a transverse direction (these bundles extend between left and right, one such glass fiber bundle 206 is shown in FIG. 2) and a normal direction (these bundles extend into the page, three such glass fiber bundles 206 are shown in FIG. 2). Each glass fiber bundle 206 includes two or more individual low-Dk-core glass fibers 208 that are typically wound around one another (e.g., in the example shown in FIG. 2, each glass fiber bundle 206 consists of seven individual low-Dk-core glass fibers 208—six outer low-Dk-core glass fibers wound around a single central low-Dk-core glass fiber).

The varnish coating 204 may be any suitable resin, including but not limited to, an epoxy-based resin, a bismaleimide triazine (BT) resin, a polyphenylene oxide (PPO)/triallylisocyanurate (TAIC) composition, and combinations thereof.

Figure 3:
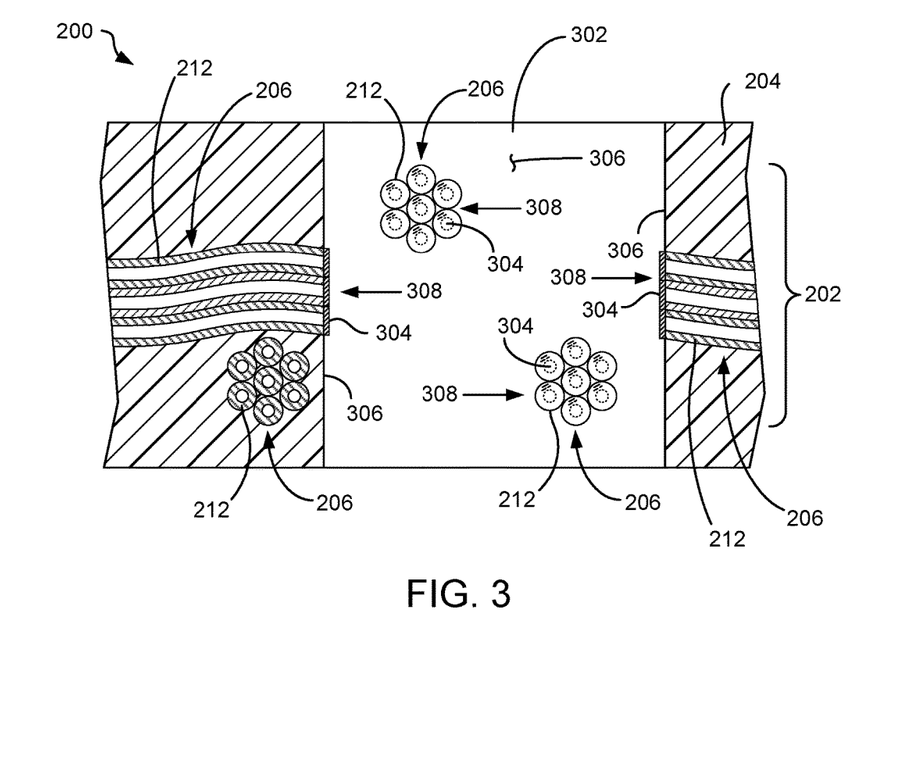
FIG. 3 is a partial, sectional view of an enhanced varnish/glass substrate after a through-hole is drilled therethrough and after at least one silane polymer barrier layer is formed over and seals the ends of hollow glass fibers exposed on a wall surface of the through-hole in accordance with some embodiments of the present invention.

Each of the low-Dk-core glass fibers 208 has a low Dk fluid core 210 surrounded by a hollow glass fiber shell 212. Hollow glass fiber shells, such as the hollow glass fiber shells 212 shown in FIGS. 2 and 3, are also referred to herein as "hollow glass fibers". Each low Dk fluid core 210 is comprised of a low Dk fluid, such as a gas (e.g., air, nitrogen and/or a noble gas) or a liquid, having a Dk value less than that of the hollow glass fiber 212. Using conventional techniques well known to those skilled in the art, prepregs and/or laminates may be fabricated using the low-Dk-core glass fibers 208.

The hollow glass fiber 212 may be any suitable conventional hollow glass fiber. The hollow glass fiber 212 may be produced by using conventional techniques well known in the art. For example, a method of making hollow glass fibers suitable for use as the hollow glass fiber 212 is disclosed in U.S. Pat. No. 4,758,259, previously incorporated herein by reference.

Hollow glass fibers suitable for use as the hollow glass fibers 212 are also commercially available. Suitable hollow glass fibers for use as the hollow glass fibers 212 include, but are not limited to, H-glass hollow glass fibers available from R&G Faserverbundwerkstoffe GmbH, Waldenbuch, Germany. H-glass fibers are made of a proprietary alkali-free alumino-borate glass, and have an outer diameter of 10-12 μm and an inner capillary "tunnel" of 5-6 μm. Such commercially available hollow glass fibers may be, for example, woven to form the glass cloth 202 using techniques well known to those skilled in the art.

Alternatively, hollow glass fiber fabrics suitable for use as the glass cloth 202 are commercially available. Suitable hollow glass fiber fabrics for use as the glass cloth 202 include, but are not limited to, H-glass fiber fabric, both plain and with an aminosilane finish, available from R&G Faserverbundwerkstoffe GmbH, Waldenbuch, Germany, under order numbers "190055X" (plain), "190050X" (silane), "190070X" (silane), and "190080X" (silane).

One problem experienced with traditional varnish/glass PCBs is known as conductive anodic filament (CAF) growth, which results from copper dissolution which emanates from the anode of an anode/cathode pair and "grows" subsurface toward the cathode of the anode/cathode pair, frequently along separated glass fiber/varnish coating interfaces. With PCBs, anode/cathode pairs are typically adjacent plated through-hole (PTH) vias. CAF formation causes a number of reliability issues and can result in catastrophic failure of PCBs, which in some instances can cause fires. The bond between the varnish and the substrate is understood to be an important factor in CAF formation and growth, as is the presence of water at the varnish/glass substrate interface.

Generally, in locations on PCBs where there are sources of copper, an electrical bias, glass fiber, and moisture, the potential exists for the formation of CAF. CAF growth results when a pathway exists along or within the individual glass fibers within the PCB where an undesired conductive path may form. In essence, a conductive filament of copper salts may grow along one or more of the glass fibers when there is both an electrical bias and moisture present, such as when an electronic device operates in a high humidity environment. The conductive filament may eventually grow to a sufficient length to short together two features (i.e., the anode/cathode pair) that should not be connected, such as adjacent PTH vias in the PCB, causing the PCB to fail.

CAF growth has been attributed to one or more of several possible scenarios, including: 1) hollow glass fibers as a result of bubbles in the liquid glass during the extrusion process that forms the glass fibers; 2) insufficient binding of the resin to the glass fibers, which may occur when the resin is initially bound to the glass fibers, or may occur during normal system operation; 3) insufficient impregnation of the resin into the bundles of glass fibers, leaving small open tracks where multiple glass fibers meet (sometimes called a "triple point").

The predominant CAF pathway is from PTH via to PTH via along a glass fiber bundle. Typically, a PCB contains a plurality of vias, each electrically connecting a conductive trace on one layer of the PCB to one or more conductive traces on one or more other layers of the PCB.

In addition to or in lieu of PTH vias, it is also not uncommon for high layer-count PCBs to have blind vias, which are visible only on one surface of the PCB, and/or buried vias, which are visible on neither surface of the PCB. While the predominant CAF pathway is from PTH via to PTH via along a glass fiber bundle, blind vias and buried vias are each also susceptible to a similar CAF pathway along a glass fiber bundle.

FIG. 3 is a cross-sectional view of the enhanced varnish/glass substrate 200 illustrated in FIG. 2 after a through-hole 302 is drilled therethrough and after at least one silane polymer barrier layer 304 is formed over the ends of hollow glass fibers 212 exposed on a wall surface 306 of the through-hole 302 in accordance with some embodiments of the present invention. Note that drilling the through-hole 302 creates several discontinuities 308 in the glass fiber bundles 206 and in the individual hollow glass fibers 212 on the wall surface 306 of the through-hole 302. These discontinuities 308, which are in essence laid-bare (untreated) ends of the glass fiber bundles 206 and the individual hollow glass fibers 212, would provide a ready CAF pathway between the PTH via that will be formed in through-hole 302 and adjacent PTH vias.

However, in accordance with some embodiments of the present invention, one or more silane polymer barrier layers 304 is/are formed on the end of hollow glass fibers 212 on the wall surface 306 of the through-hole 302. The silane polymer barrier layer 304 effectively seals the hollow glass fibers 212 and eliminates the conductive anodic filament (CAF) pathway between the PTH via that will be formed in the through-hole 302 and adjacent PTH vias.

In general, the enhanced varnish/glass substrate 200 may be any composite structure used in PCB construction, such as a prepreg or a core.

Figure 4:
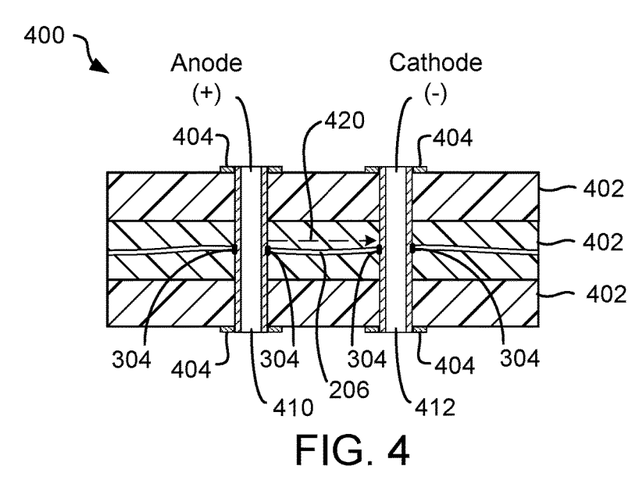
FIG. 4 is a partial, sectional view of a printed circuit board (PCB) constructed using an enhanced substrate in accordance with some embodiments of the present invention.

FIG. 4 is a cross-sectional view of a printed circuit board (PCB) 400 constructed using an enhanced substrate in accordance with some embodiments of the present invention. The PCB 400 has plurality of insulator layers 402 and conductive traces 404. Each of the insulator layers 402 shown in FIG. 4 may correspond with the varnish/glass substrate 200 shown in FIGS. 2 and 3. Typically, vias are electroplated (e.g., copper or other highly conductive metal) onto through-holes drilled into the PCB. Such a via, which extends from one surface of the PCB to the other surface of the PCB, is referred to as a plated through-hole (PTH) via. Two exemplary PTH vias 410 and 412 are illustrated in FIG. 4.

In FIG. 4, PTH vias 410 and 412 constitute an anode/cathode pair due to an electrical bias between the PTH via 410 and the PTH via 412. That is, the PTH via 410 has a voltage higher than that of the PTH via 412. Hence, in FIG. 4, the PTH via 410 is also labeled as "Anode (+)" and the PTH via 412 is also labeled as "Cathode (−)." An exemplary CAF pathway 420 is illustrated in FIG. 4 as a "dashed-line" that extends from the Anode PTH via 410 to the Cathode PTH via 412 along a glass fiber bundle 206 and within the individual hollow glass fibers 212 (not shown in FIG. 4).

However, in accordance with some embodiments of the present invention, one or more silane polymer barrier layers 304 is/are formed on the end of glass fiber bundles 206 and the individual hollow glass fibers 212 (not shown in FIG. 4) in accordance with some embodiments of the present invention. The silane polymer barrier layer 304 effectively seals the glass fiber bundles 206 and the individual hollow glass fibers 212 (not shown in FIG. 4) and eliminates the conductive anodic filament (CAF) pathway from the Anode PTH via 410 to the Cathode PTH via 412 along the glass fiber bundle 206 and within the individual hollow glass fibers 212. The CAF pathway 420 is illustrated in FIG. 4 as a "dashed-line" because this CAF pathway is eliminated by the one or more silane polymer barrier layers 304.

Figure 5:
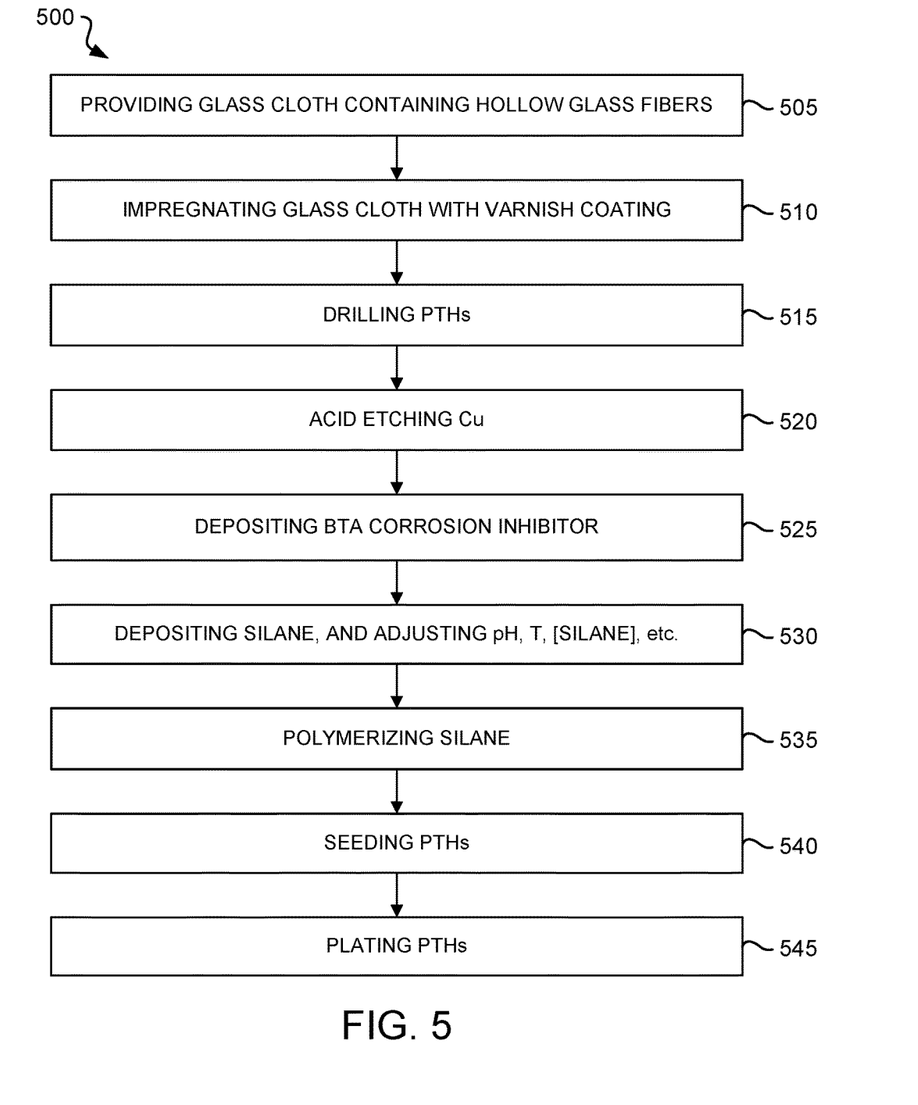
FIG. 5 is a flow diagram illustrating an exemplary method of fabricating one or more vias in a printed circuit board (PCB) or other substrate in accordance with some embodiments of the present invention.

FIG. 5 is a flow diagram illustrating an exemplary method 500 of fabricating one or more vias in a printed circuit board (PCB) or other substrate in accordance with some embodiments of the present invention. In the method 500, the steps discussed below (steps 505-545) are performed. These steps are set forth in their preferred order. It must be understood, however, that the various steps may occur simultaneously or at other times relative to one another. Moreover, those skilled in the art will appreciate that one or more steps may be omitted.

The method 500 begins by providing a glass cloth containing hollow glass fibers or other hollow glass fiber substrate (step 505). For example, a glass cloth containing hollow glass fibers may be obtained commercially, or may be woven from hollow glass fibers obtained commercially.

Then, the method 500 continues by impregnating the glass cloth containing hollow glass fibers with a varnish coating (step 510). The glass cloth may be impregnated with an epoxy-based resin, for example, to form a varnish/glass substrate. The varnish/glass substrate is subsequently provided with conductive traces using conventional PCB fabrication techniques well known to those skilled in the art.

Next, the method 500 continues by drilling one or more through-holes in a varnish/glass substrate at one or more PTH via formation locations (step 515). Each of the through-holes extends completely through the varnish/glass substrate. Conventional through-hole drilling techniques utilized in printed circuit board (PCB) fabrication are applied during this step.

Subsequent to drilling the through-holes in the varnish/glass substrate, the drilled through-holes are typically desmeared. Desmear is a conventional PCB fabrication process by which epoxy resin is cleaned from the inside of drilled through-holes, typically by utilizing a permanganate solution.

Then, the method 500 continues by acid etching the conductive traces exposed in the drilled through-holes to remove oxide using conventional techniques (step 520). The conductive traces, which are typically copper, include portions that are exposed in the drilled through-holes. The exposed portions of the conductive traces may become oxidized when the through-holes are drilled and desmeared. Hence, the resulting oxide is typically removed from the exposed portions of the conductive traces by acid etching. For example, the substrate may be immersed in an acid bath. Typically, the acid bath contains a hydrochloric acid solution. One skilled in the art will appreciate, however, that one or more other conventional techniques may be used to remove oxide from the exposed portions of the conductive traces in lieu of, or in addition to, acid etching.

Subsequent to acid etching the conductive traces exposed in the drilled through-holes, the substrate is typically rinsed using conventional techniques. For example, the substrate may be subjected to a water rinse after the acid etching step.

Then, the method 500 continues by depositing benzotriazole (BTA) on the conductive traces exposed in the drilled through-holes (step 525). BTA is a conventional corrosion inhibitor. The BTA is deposited using conventional techniques. For example, the substrate may be immersed in a BTA bath, typically containing a solution of 1-3 wt % BTA dissolved in either water or ethanol, or a combination thereof. Typically, the substrate is immersed in the BTA bath for several hours at room temperature (RT) and atmospheric pressure. A suitable immersion time is empirically determined. A suitable immersion time will typically vary based on myriad factors such as the concentration of BTA in the solution, whether the solution is water-based and/or ethanol-based, the temperature of the solution, and the pressure under which immersion is performed. Generally, a suitable immersion time is 24 hours or less. The BTA coats the exposed conductive traces and prevents chemisorption of silane in one or more subsequent steps (e.g., steps 530 and 535, described below). The use of BTA is exemplary. One skilled in the art will appreciate that one or more other conventional corrosion inhibitors may be used in lieu of, or in addition to, BTA to coat the exposed conductive traces and prevent subsequent chemisorption of silane.

Next, the method 500 continues by depositing a silane on the hollow glass fibers exposed in the drilled through-holes (step 530). The silane is deposited using conventional surface modification techniques, such as immersion or vapor pressure deposition (VPD). It is typically necessary to adjust one or more process parameters of the conventional surface modification technique used in step 530 to deposit a sufficient layer of silane on the exposed glass fiber bundle ends. The silane reacts in step 530 with the exposed silanols on the glass to form a siloxane, which can be further polymerized to form a silane polymer barrier layer on the exposed glass fiber ends (step 535). This silane polymer barrier layer effectively seals the glass bundles and the individual hollow glass fibers and eliminates the CAF pathway.

The environment in which step 530 is performed can determine, at least to some extent, the fluid that is sealed within the hollow glass fibers exposed in the drilled through-holes. This fluid may be a gas (e.g., air, nitrogen and/or a noble gas) or a liquid. For example, step 530 may be performed in an air environment to seal air in the hollow glass fibers. Likewise, step 530 may be performed in a nitrogen environment or a noble gas environment to seal those gases in the hollow glass fiber. Alternatively, step 530 may be performed in a liquid to seal that liquid in the hollow glass fiber. In yet another alternative, step 530 may be performed in a vacuum to seal a vacuum in the hollow glass fiber.

Preferably, the silane used in step 530 is one or more organo trialkoxysilanes including, but not limited to, conventional silane coupling agents such as vinylbenzylaminoethylaminopropyl-trimethoxysilane, diallylpropylisocyanuratetrimethoxysilane, and the like. Organo trialkoxysilanes, which have the general formula structure $RSi(OR')_3$, are coupling agents. R is an organic functional group, such as an alkyl, an aryl, an alkenyl, and —$NR'_2$, SH, COOH, $SO_3H$, NCO, epoxy, acrylate functionalized organics. R' is an alkyl, a cycloalkyl, an aryl, a heteroaryl, a non-aromatic heterocyclic ring, or an allyl. Other suitable organo trialkoxysilanes suitable for use in this depositing step include, but are not limited to, n-octyltrimethoxysilane, 3-methacryloxypropyltrimethoxysilane, n-(2-aminoethyl)-3-aminopropyltrimethoxysilane, n-[2(vinylbenzylamino)-ethyl]-3-aminopropyltrimethoxysilane, and 3-glycidoxypropyltrimethoxysilane. Additional silanes that may be suitable for use in this depositing step include those listed in Table 1.10 "Critical Surface Tensions of Silane Coupling Agent Film" (p. 23) and Table 2.2 "Representative Commercial Silanes" (p. 34) of Plueddemann, "Silane Coupling Agents," $2^{nd}$ edition, Plenum Press, New York, 1991, which tables are hereby incorporated herein by reference in their entirety.

In the case of immersion, for example, the substrate may be subjected to a silane bath, the process parameters of which (e.g., temperature, pH, silane concentration, and immersion time) are adjusted to deposit a sufficient layer of silane on the exposed glass fiber bundle ends. Suitable process parameters are empirically determined. Suitable process parameters will typically vary in an interrelated fashion and based on myriad factors such as the particular silane used in the bath, and whether the bath solution is water-based and/or alcohol-based. Generally, the temperature of the silane bath ranges from room temperature (RT) to 80° C., the silane bath is typically acidic (pH 3-5) to prevent self-condensation of the silane, and the immersion time is typically 24 hours or less. A surfactant may be added to the silane bath to enhance wetting of the glass fibers as well as prevent foaming.

Generally, in step 530 the concentration of the silane can range from 0.01 to 100% (vol), preferably 0.05 to 10% (vol) and most preferably 0.1 to 3% (vol). The duration the substrate is exposed to the silane bath can range, for example, from 0.1 minutes to 24 hours, preferably 0.5 to 180 minutes and most preferably 2 to 30 minutes, depending on the final silane surface coverage desired.

The following first illustrative example is for purposes of illustration and is non-limiting. In the first illustrative example, step 530 is performed by dipping the substrate for 2 to 30 minutes into an aqueous silane bath containing 0.1%-0.5% organo trialkoxysilane/water solution (or water-ethanol). In the first illustrative example, the organo trialkoxysilane is vinylbenzylaminoethylaminopropyl-trimethoxysilane or diallylpropylisocyanurate-trimethoxysilane. The temperature of the silane bath is within the range from room temperature (RT) to 80° C. The silane bath is made acidic (pH 3-5) to prevent self-condensation of the silane. The pH of the silane bath may be adjusted with a suitable acid, such as glacial acetic acid. The silane reacts through its trialkoxy groups with the exposed silanols on the glass to form a siloxane. The substrate is then air-dried.

As this first illustrative example continues, step 535 is performed by placing the substrate in a desiccator at 110-120° C. for 5-10 minutes. The siloxane formed in step 530 is polymerized to form a silane polymer barrier layer on the exposed glass fiber bundle ends. In this first illustrative example, the silane polymer barrier layer is formed in step 535 through the application of heat to the siloxane formed in step 530. Alternatively, one or more monomers and a thermal initiator (optional) may be added to the siloxane formed in step 530 so that the one or more added monomers participate in the polymerization along with the siloxane formed in step 530 to form the silane polymer barrier layer in step 535.

The following second illustrative example is for purposes of illustration and is non-limiting. In the second illustrative example, step 530 is performed by using an alcohol solution for silylating the surface of the substrate with an organo trialkoxysilane. A 2% silane solution can be prepared in a suitable alcohol (e.g., methanol, ethanol, isopropanol, and the like). In the second illustrative example, the organo trialkoxysilane is vinylbenzylaminoethylaminopropyl-trimethoxysilane or diallylpropylisocyanurate-trimethoxysilane. The surface of the substrate can be wiped, dipped, or sprayed with this solution. If the substrate is dipped into the solution, a sufficient submersion time (e.g., one or two minutes) may be necessary to allow silane migration to the surface of the substrate. The substrate is then dried (e.g., air-dried). After the surface of the substrate dries, excess material can be gently wiped, or briefly rinsed off with alcohol.

As this second illustrative example continues, step 535 is performed by heating the substrate for 5-10 minutes at 110° C. (alternatively, step 535 may be performed by maintaining the substrate at ambient temperature for 24 hours). The siloxane formed in step 530 is polymerized to form a silane polymer barrier layer on the exposed glass fiber bundle ends. In this second illustrative example, the silane polymer barrier layer is formed in step 535 through the application of heat to the siloxane formed in step 530. Alternatively, one or more monomers and a thermal initiator (optional) may be added to the siloxane formed in step 530 so that the one or more added monomers participate in the polymerization along with the siloxane formed in step 530 to form the silane polymer barrier layer in step 535.

The following third illustrative example is for purposes of illustration and is non-limiting. In the third illustrative example, step 530 is performed by placing the substrate in a vapor phase of an organo trialkoxysilane. In the third illustrative example, the organo trialkoxysilane is vinylbenzylaminoethylaminopropyl-trimethoxysilane or diallylpropylisocyanurate-trimethoxysilane. To modify the exposed glass fiber bundle ends with the silane using vapor phase deposition techniques, the substrate must be passed through or placed within a chamber that allows for the silane to build up a vapor pressure. Such vapor deposition techniques are well known by those skilled in the art.

As this third illustrative example continues, step 535 is performed by removing the substrate from the chamber and heating the substrate for 5-10 minutes at 110° C. The siloxane formed in step 530 is polymerized to form a silane polymer barrier layer on the exposed glass fiber bundle ends. In this third illustrative example, the silane polymer barrier layer is formed in step 535 through the application of heat to the siloxane formed in step 530. Alternatively, one or more monomers and a thermal initiator (optional) may be added to the siloxane formed in step 530 so that the one or more added monomers participate in the polymerization along with the siloxane formed in step 530 to form the silane polymer barrier layer in step 535.

Once the silane polymer barrier layer is formed, the substrate may then be further processed using conventional PCB fabrication techniques, such as depositing Cu plating seed (step 540) and Cu plating to form the conductive PTH vias (step 545). In step 540, Cu plating seed is deposited in the through-holes. Conventional seeding techniques utilized in PCB fabrication are applied during this step. In step 545, the through-holes are plated with Cu to form the PTH vias. Conventional plating techniques (i.e., conventional electroless plating techniques and/or conventional electroplating techniques) utilized in PCB fabrication are applied during this step. One skilled in the art will appreciate that any desired metal may be used to form the PTH vias through the use of suitable conventional seeding/plating techniques.

One skilled in the art will appreciate that many variations are possible within the scope of the present invention. For example, although some embodiments of the present invention are described herein in the context of a printed circuit board (PCB), the present invention may be utilized in the context of other substrates, such as a laminate subcomposite, an interconnect substrate (e.g., an interposer or a module substrate) or a flex cable. Likewise, the present invention may be utilized in the context of forming all type of vias, including PTH vias, buried vias, and blind vias. Thus, while the present invention has been particularly shown and described with reference to some embodiments thereof, it will be understood by those skilled in the art that these and other changes in form and detail may be made therein without departing from the spirit and scope of the present invention.

What is claimed is:

1. A method of making a substrate containing low-Dk-core glass fibers, the method comprising:
    providing a substrate having a plurality of insulator layers and one or more conductive traces, wherein each of the insulator layers comprises a glass fiber substrate impregnated with a varnish coating, wherein a plurality of through-holes each of which extends completely through the substrate from a first surface of the substrate to a second surface of the substrate and passes through the glass fiber substrate of each of the insulator layers, and wherein the glass fiber substrate of one of the insulator layers includes one or more hollow glass fibers extending from a first one of the through-holes to a second one of the through-holes;
    forming a silane polymer barrier layer over a first end of each of the one or more hollow glass fibers in the first one of the through-holes;
    forming a silane polymer barrier layer over a second end of each of the one or more hollow glass fibers in the second one of the through-holes;
    wherein the silane polymer barrier layer formed over the first end of each of the hollow glass fibers and the silane polymer barrier layer formed over the second end of each of the hollow glass fibers seal a low Dk fluid within the hollow glass fibers, thereby forming a low-Dk-core glass fiber.

2. The method as recited in claim 1, wherein the step of forming a silane polymer barrier over a first end of each of the one or more hollow glass fibers in the first one of the through-holes and the step of forming a silane polymer barrier layer over a second end of each of the one or more hollow glass fibers in the second one of the through-holes are performed substantially simultaneously.

3. The method as recited in claim 2, wherein the silane polymer barrier layer is formed over the first and second ends of each of the one or more hollow glass fibers using an aqueous silane bath.

4. The method as recited in claim 2, wherein the silane polymer barrier layer is formed over the first and second ends of each of the one or more hollow glass fibers using vapor phase deposition.

5. The method as recited in claim 1, wherein the step of forming a silane polymer barrier layer over the first end of each of the hollow glass fibers in the first one of the through-holes and the step of forming a silane polymer barrier layer over a second end of each of the one or more hollow glass fibers in the second one of the through-holes each includes the steps of:

depositing an organo trialkoxy silane on the respective end of each of the one or more hollow glass fibers exposed on the wall surface of the respective one of the through-holes to form a siloxane over the respective end of each of the hollow glass fibers;

polymerizing the siloxane to form the silane polymer barrier layer.

6. The method as recited in claim 5, wherein the organo trialkoxy silane is selected from a group consisting of vinylbenzylaminoethylaminopropyl-trimethoxysilane, diallylpropylisocyanuratetrimethoxysilane, n-octyltrimethoxysilane, and combinations thereof.

7. The method as recited in claim 5, further comprising the step of:

prior to the step of depositing an organo trialkoxy silane on the respective end of each of the one or more hollow glass fibers exposed on the wall surface of the respective one of the through-holes, depositing a corrosion inhibitor on an end of each conductive trace exposed on the wall surface of the respective one of the through-holes.

8. The method as recited in claim 7, wherein the corrosion inhibitor is bezotriazole (BTA).

* * * * *